US010121753B2

(12) United States Patent
Oetjen et al.

(10) Patent No.: US 10,121,753 B2
(45) Date of Patent: Nov. 6, 2018

(54) ENHANCED SOLDER PAD

(71) Applicant: Infineon Technologies AG, Neubiberg (DE)

(72) Inventors: Jens Oetjen, Ottenhofen/Herdweg (DE); Stefan Macheiner, Kissing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/642,810

(22) Filed: Jul. 6, 2017

(65) Prior Publication Data

US 2018/0012854 A1 Jan. 11, 2018

(30) Foreign Application Priority Data

Jul. 6, 2016 (DE) ........................ 10 2016 112 390

(51) Int. Cl.
*H01L 23/00* (2006.01)
*H01L 23/495* (2006.01)
*H01L 21/48* (2006.01)

(52) U.S. Cl.
CPC .......... *H01L 24/05* (2013.01); *H01L 21/4821* (2013.01); *H01L 23/49527* (2013.01); *H01L 23/49582* (2013.01); *H01L 24/03* (2013.01); *H01L 2224/0345* (2013.01); *H01L 2224/0346* (2013.01); *H01L 2224/0512* (2013.01); *H01L 2224/05023* (2013.01); *H01L 2224/05113* (2013.01); *H01L 2224/05155* (2013.01); *H01L 2224/05568* (2013.01); *H01L 2224/05573* (2013.01); *H01L 2224/05611* (2013.01)

(58) Field of Classification Search
CPC ... H01L 24/05; H01L 24/03; H01L 23/49582; H01L 23/49527
See application file for complete search history.

(56) References Cited

U.S. PATENT DOCUMENTS

| | | | | |
|---|---|---|---|---|
| 6,554,180 | B1 | 4/2003 | Katoh | |
| 6,592,020 | B1 | 7/2003 | Currie et al. | |
| 2004/0035911 | A1* | 2/2004 | Dockus | B23K 35/002 228/56.3 |
| 2004/0108367 | A1 | 6/2004 | Farooq et al. | |
| 2006/0013722 | A1 | 1/2006 | Brand et al. | |
| 2006/0068128 | A1 | 3/2006 | Greener et al. | |
| 2006/0081995 | A1 | 4/2006 | Takahashi et al. | |
| 2006/0252249 | A1* | 11/2006 | Hsu | H01L 21/4853 438/614 |
| 2006/0261131 | A1 | 11/2006 | Hirata et al. | |
| 2007/0172690 | A1 | 7/2007 | Kim et al. | |
| 2008/0237314 | A1 | 10/2008 | Yu et al. | |
| 2009/0220812 | A1 | 9/2009 | Kato et al. | |
| 2010/0102444 | A1 | 4/2010 | Khor et al. | |
| 2010/0307823 | A1 | 12/2010 | Kawamata et al. | |

(Continued)

FOREIGN PATENT DOCUMENTS

| | | |
|---|---|---|
| DE | 10 2010 028 199 | 10/2011 |
| DE | 10 2012 208 681 | 11/2013 |

(Continued)

*Primary Examiner* — Jarrett J Stark
(74) *Attorney, Agent, or Firm* — Dicke, Billig & Czaja, PLLC

(57) ABSTRACT

A solder pad includes a surface. A tin layer is arranged on the surface. At least one out of a bismuth layer, an antimony layer and a nickel layer is arranged on the tin layer.

20 Claims, 4 Drawing Sheets

(56) References Cited

U.S. PATENT DOCUMENTS

| | | | | |
|---|---|---|---|---|
| 2011/0204121 | A1 | 8/2011 | Kawamata et al. | |
| 2014/0061287 | A1 | 3/2014 | Ohnishi et al. | |
| 2015/0108650 | A1 | 4/2015 | Chen | |
| 2015/0123253 | A1* | 5/2015 | Hwang | H01L 24/29 257/676 |
| 2015/0364430 | A1 | 12/2015 | Lin | |
| 2016/0351516 | A1* | 12/2016 | Karlovsky | H01L 24/05 |
| 2017/0179062 | A1* | 6/2017 | Jang | H01L 24/14 |

FOREIGN PATENT DOCUMENTS

| | | |
|---|---|---|
| DE | 10 2014 217 923 | 3/2016 |
| EP | 1 245 328 | 10/2002 |
| EP | 2 768 293 | 8/2014 |
| KR | 101116283 | 4/2011 |
| WO | 00/48784 | 8/2000 |
| WO | 2005/099961 | 10/2005 |
| WO | 2006/114267 | 11/2006 |
| WO | 2007/070548 | 6/2007 |
| WO | 2009/117476 | 9/2009 |
| WO | 2015028813 | 3/2015 |
| WO | 2015/103362 | 7/2015 |

* cited by examiner

ENHANCED SOLDER PAD

CROSS-REFERENCE TO RELATED APPLICATION

This Utility Patent Application claims priority to German Patent Application No. 10 2016 112 390.0, filed Jul. 6, 2016, which is incorporated herein by reference.

FIELD

The present disclosure relates in general to a solder pad. The disclosure further relates to a leadframe. The disclosure further relates to an electronic component, in particular an electronic component including the solder pad. The disclosure further relates to a method for enhancing a solder pad surface.

BACKGROUND

Electronic components may be mounted on a board to interact in an electronic circuit. For example, the board may be a printed circuit board (PCB). Fixing the electronic components to the board may be effectuated by soldering the electronic components using solder pads of the electronic components to solder pads arranged on the board.

Board level reliability may be a challenge in high temperature environments. Especially in automotive applications an improved fixing of the components to the board may be demanding. In automotive applications the board may be subject to a harsh environment including high temperature and strong vibrations. A connection quality of components to the board may be visible in the temperature cycle on board (TCoB) performance.

A standard solder widely used in industry is an alloy including tin, silver and copper. The alloy is known under the name SAC. The alloy may be used in different compositions. One composition is SnAg3.8Cu0.7. This alloy is known as SAC387. SAC387 may not meet all requirements in a harsh environment. An actual SAC387 solder performance may be inferior to a performance of tin-lead solder.

SUMMARY

Various aspects pertain to a solder pad including a surface. A tin layer is arranged on the surface. At least one out of a bismuth layer, an antimony layer and a nickel layer is arranged on the tin layer.

Various aspects pertain to a solder pad including a surface. A tin layer is arranged on the surface. The tin layer includes particles of at least one out of bismuth particles, antimony particles and nickel particles.

Various aspects pertain to a method for enhancing a solder pad surface. The method includes the following acts: providing a solder pad including at least one solder pad surface; plating or sputtering tin onto the at least one solder pad surface to form a first tin layer; plating or sputtering bismuth onto the first tin layer to form a first bismuth layer; plating or sputtering antimony onto the first bismuth layer to form a first antimony layer; plating or sputtering nickel onto the first antimony layer to form a first nickel layer.

BRIEF DESCRIPTION OF THE DRAWINGS

The accompanying drawings are included to provide a further understanding of examples and are incorporated in and constitute a part of this description. The drawings illustrate examples and together with the description serve to explain principles of examples. Other examples and many of the intended advantages of examples will be readily appreciated as they become better understood by reference to the following detailed description.

DETAILED DESCRIPTION

Figure 1:
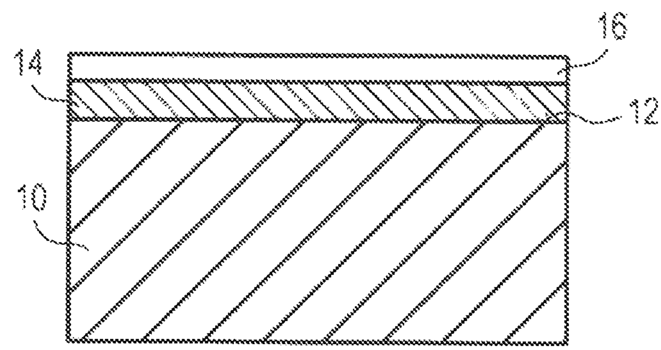
FIG. 1 schematically illustrates a first example of a solder pad in accordance with the disclosure in a cross-sectional view.

In the following description, examples are described with reference to the drawings which form a part thereof wherein like reference numerals are generally utilized to refer to like elements throughout. In the following description, for purposes of explanation, numerous specific details are set forth in order to provide a thorough understanding of one or more aspects of examples. However, it may be evident to a person skilled in the art that one or more aspects of the examples may be practiced with a lesser degree of these specific details. The following description is therefore not to be taken in a limiting sense, and the scope of protection is defined by the appended claims.

The various aspects summarized may be embodied in various forms. The following description shows by way of illustration various combinations and configurations in which the aspects may be practiced. In this regard, directional terminology, such as e.g. “upper”, “lower”, “top”, “bottom”, “left-hand”, “right-hand”, “frontside”, “backside”, “vertical”, “horizontal”, etc., may be used with reference to the orientation of the figures being described. Since components of examples can be positioned in a number of different orientations, the directional terminology is used for purposes of illustration and is in no way limiting.

It is understood that the described aspects and/or examples are merely examples and that other aspects and/or examples may be utilized and structural and functional modifications may be made without departing from the concept of the present disclosure. In addition, while a particular feature or aspect of an example may be disclosed with respect to only one of several implementations, such feature or aspect may be combined with one or more other features or aspects of the other implementations as it may be desired and advantageous for any given or particular application.

Further, to the extent that the terms “include”, “have”, “with” or other variants thereof are used in either the detailed description or the claims, such terms are intended to be inclusive in a manner similar to the term “comprise”.

Also, the term "exemplary" is merely meant as an example, rather than the best or optimal.

Solder pads and methods for enhancing solder pads are described herein. Comments made in connection with the described solder pads may also hold true for corresponding methods and vice versa. For example, if a specific material of a solder pad is described, a corresponding method for enhancing a solder pad may include an act of providing the corresponding material in a suitable manner, even if such an act is not explicitly described or illustrated in the figures. Similarly, the method may include an act of providing the specific component.

Electronic components described herein may include one or more semiconductor chips or semiconductor dies. The dies may be manufactured by different technologies and may include, for example, integrated electrical, electro-optical or electro-mechanical circuits and/or passives. The dies may include integrated circuits such as, e.g., logic integrated circuits, control circuits, microprocessors, memory devices. The dies may be of arbitrary type and need not be manufactured from specific semiconductor material such as for example Si, SiC, SiGe, GaAs or an organic semiconductor material, and, furthermore, may contain inorganic and/or organic materials that are not semiconductors, such as for example insulators, plastics or metals.

Solder pads and leadframes as described herein may be of different materials. Examples of materials may include, but are not limited to, copper, aluminum and silver-plated. A solder pad or a leadframe may include copper, aluminum, a copper alloy, an alloy 42, a steel alloy, an aluminum alloy and so on as a base material. The base material may be plated with other metal layers.

Leadframes as described herein may include a die pad. A die pad may have an upper surface and a lower surface opposite the upper surface. A die pad may include a die mounting surface. The die mounting surface may be on an upper surface. The die mounting surface may be coplanar to the upper surface of the die pad. The die mounting surface may be separated by the upper surface of the die pad by a step, i.e. the die mounting surface may be in a different plane than the upper surface. The die mounting surface may be smaller than the die pad surface. The die mounting surface may be arranged in the middle of the die pad.

Leadframes as described herein may include one or a plurality of lead fingers. A lead finger may include an inner contact pad. In one example, lead fingers may be arranged on one side of the die pad. In a further example, lead fingers may be arranged all around the die pad.

Solder pads as described herein may be of arbitrary form. For example, a solder pad may have a flat surface. A solder pad in the meaning of the present disclosure may also include convex or concave surfaces. A solder pad may e.g. be formed by a surface of a wire.

Solder pad surfaces as described herein may be covered by a tin layer. An upper material layer may be provided on the tin layer. During a soldering process the tin layer may interact together with the upper material layer with a SAC solder, especially a SAC387 solder used for soldering the solder pad to a corresponding solder pad.

During a soldering process an alloy may form in the vicinity of the solder pad. The alloy may enhance stability of the formed solder connection. In particular, the alloy may enhance stability of the formed solder connection for higher operating temperatures. The alloy may particularly enhance stability of the formed solder connection for operating temperatures up to 150° C. The alloy may raise a creep resistance, thus increasing the durability of the solder connection under temperature cycling conditions. A melting temperature of the alloy may be in a same temperature range as a melting temperature of the SAC solder used.

Solder pad surfaces as described herein may be covered by a tin layer, and the tin layer may be covered by a bismuth layer, an antimony layer and a nickel layer.

During a soldering process an alloy may form in the vicinity of the solder pad based on the layer materials tin, bismuth, antimony and nickel together with the materials included in the SAC solder, i.e. tin, silver and copper. Tin may constitute the major part of the alloy.

Bismuth and nickel may interact to form intermetallic phases NiBi with 74 wt. % Bi or 91 wt. % Bi. The intermetallic NiBi phases may harden the solder connection.

The alloy formed in the vicinity of the solder pad may include a ratio of antimony to bismuth of about 1 to about 1.5 up to a ratio of about 1 to about 3 (based on the antimony weight). This ratio may lead to a low grain size structure in the solder connection.

FIG. 1 shows in a cross-sectional view a solder pad 10. The solder pad 10 may be of any form and size. In one example, a possible solder pad size may be about 0.25 mm□0.8 mm. In a further example, a possible solder pad size may also be about 0.2 mm□0.5 mm. However, a solder pad size may have any other suitable dimension. The solder pad may be a flat pad integrated in a housing of a so-called leadless package. The solder pad may be part of a lead of a leaded package. The solder pad may be a wire. It is to be noted that FIG. 1 is only intended to schematically illustrate a cross-sectional view of a solder pad.

The solder pad 10 may include a surface 12. The surface of the solder pad 10 may lie in a plane. The surface of the solder pad 10 may be of a convex form representing the surface of a wire. The surface of the solder pad 10 may also have another suitable form.

A tin layer may be arranged on the surface 12. The tin layer 14 may have a thickness in a range from about 5 micrometer to about 15 micrometer. In an example, the thickness of the tin layer 14 may lie in a range from about 7 micrometer to about 12 micrometer. In another example, the thickness of the tin layer may lie in a range from about 9 micrometer to about 11 micrometer.

A layer 16 may be disposed or arranged on top of the tin layer 14. The layer 16 may be a bismuth layer, an antimony layer or a nickel layer.

The solder pad 10 may be soldered with its surface 12, on which the tin layer 14 and the further layer 16 are arranged, to a PCB using an SAC solder paste. During the soldering process the tin layer 14 together with the upper layer 16 may interact with the solder SAC387. The properties of the solder SAC387 may therefore be modified in the vicinity of the solder pad 12. The bulk material formed after board assembly may enhance the temperature cycle on board performance.

Figure 2:
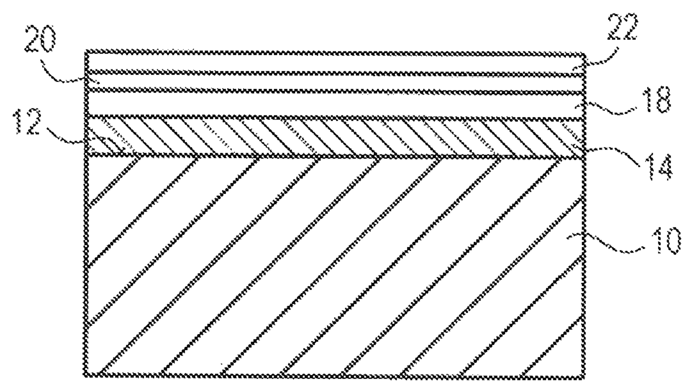
FIG. 2 schematically illustrates a second example of a solder pad in accordance with the disclosure in a cross-sectional view.

FIG. 2 shows in a cross-sectional view a second example of a solder pad 10. The solder pad 10 may have the surface 12 on which the tin layer 14 may be arranged. On top of the tin layer 14 a bismuth layer 18 may be arranged. On top of the bismuth layer 18 an antimony layer 20 may be arranged. On top of the antimony layer 20 a nickel layer 22 may be arranged. Although not visible in FIG. 2, each layer may cover essentially the entire respective underlying layer. The thickness of the tin layer 14 may be the same as explained with reference to FIG. 1.

The thickness of the bismuth layer 18 may lie in a range from about 2 micrometer to about 10 micrometer. In one example, the thickness of the bismuth layer 18 may lie in a range from about 4 micrometer to about 8 micrometer. In a further example, the thickness of bismuth layer 18 may lie in a range from about 5 micrometer to about 7 micrometer.

The antimony layer 20 may have a thickness which may lie in a range from about 1 micrometer to about 6 micrometer. In one example, the thickness of antimony layer 20 may lie in a range from about 2 micrometer to about 5 micrometer. In another example, the thickness of antimony layer 20 may lie in a range from about 3 micrometer to about 4 micrometer.

The nickel layer 22 may have a thickness that may lie in a range from about 0.1 micrometer to about 0.6 micrometer. In one example, the thickness may lie in a range from about 0.2 micrometer to about 0.5 micrometer. In a further example, the thickness of nickel layer 22 may lie in a range from about 0.3 micrometer to about 0.4 micrometer.

A relation of a thickness of the bismuth layer 18 to a thickness of the nickel layer 22 may be about 20:1. A relation of a thickness of the bismuth layer 18 to a thickness of the antimony layer 20 may be about 2:1. A relation of a thickness of the antimony layer 20 to a thickness of the nickel layer 22 may be about 10:1. A relation of a thickness of the tin layer 14 to a total thickness of the bismuth layer 18, the antimony layer 20 and the nickel layer 22 may be between about 0.3:1 and 5:1.

FIG. 2 shows a layer stack including on top of the tin layer 14, first the bismuth layer 18, then the antimony layer 20 and then the nickel layer 22. It is to be understood that an order of the three layers (bismuth, antimony and nickel) may be different. For example, the antimony layer 20 may be deposited directly on the tin layer 14 followed by the bismuth layer 18.

As for the first example shown in FIG. 1, an interaction will take place when soldering the solder pad 10 with its surface 12 including the overlying layers 14, 18, 20 and 22 with a standard SAC387 to a board. Solder SAC387 may form an alloy with the materials tin, bismuth, antimony and nickel which may improve stability of the solder joint especially during temperature cycles.

Figure 3:
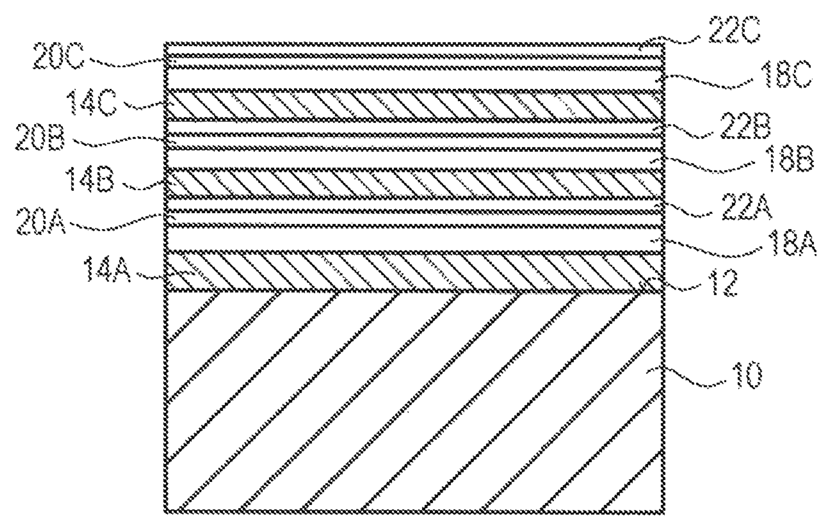
FIG. 3 schematically illustrates a third example of a solder pad in accordance with the disclosure in a cross-sectional view.

FIG. 3 shows a third example of an enhanced solder pad 10 having the surface 12. In the third example, the solder pad 10 may have on its surface 12 the same layer stack as shown in FIG. 2, beginning with a tin layer 14A, a bismuth layer 18A, an antimony layer 20A and a nickel layer 22A. In contrast to the second example, the third example is a multi-stack example. In other words, on top of the nickel layer 22A a new layer stack may start with a tin layer 14B arranged on top of the nickel layer 22A. A bismuth layer 18B may be arranged on the tin layer 14B. An antimony layer 20B may be arranged on the bismuth layer 18B. A nickel layer 22B may be arranged on the antimony layer 22B. The layers 14B, 18B, 20B and 22B may form a second layer stack. On top of the second layer stack, a third layer stack may be formed. On top of the nickel layer 22B a tin layer 14C may be arranged. On top of the tin layer 14C a bismuth layer 18C may be arranged. On top of the bismuth layer 18C an antimony layer 20C may be arranged. On top of the antimony layer 20C a nickel layer 22C may be arranged. The third example, as shown in FIG. 3, is a three layer stack example. It is understood that instead of three stacks also two, four or another number of superposed stacks is possible.

The three stacks shown in FIG. 3 are illustrated as being of a greater total thickness compared to the stack of FIG. 2. It is understood that this may not be necessarily true in a real application. The thickness of the tin layer 14A plus the thickness of the tin layer 14B added to the thickness of the tin layer 14C may lie in a range from about 5 micrometer to about 15 micrometer. For example, each of the three tin layers may have a thickness of about 2 micrometer, summing up to a total thickness of 6 micrometer. In another example, each of the tin layers 14A, 14B and 14C may have a thickness of about 5 micrometer adding up to about 15 micrometer. The tin layers 14A, 14B and 14C are not necessarily of the same thickness. Each of the tin layers 14A, 14B and 14C may have another thickness. In an example, the thickness of the tin layer 14A may be about 3 micrometer. The thickness of the tin layer 14B may be of about 2 micrometer. The thickness of tin layer 14C may be of about 1 micrometer. The total thickness of the tin layers 14A, 14B and 14C may then be about 6 micrometer and may lie in a range from about 5 micrometer to about 15 micrometer. In a further example, the total thickness of the tin layers 14A, 14B and 14C may lie in a range from about 7 micrometer to about 12 micrometer. In another example, the total thickness of the tin layers 14A, 14B and 14C may lie in a range from about 9 micrometer to about 11 micrometer.

The same holds true for the bismuth layers 18A, 18B and 18C, the antimony layers 20A, 20B and 20C and the nickel layers 22A, 22B and 22C which may be of equal thickness or different thicknesses with a range of a total thickness for each material as given below.

The total thickness of the bismuth layers 18A, 18B and 18C may lie in a range from about 2 micrometer to about 10 micrometer, or from about 4 micrometer to about 8 micrometer.

In a further example, the total thickness of the three bismuth layers may lie in a range from about 5 micrometer to about 7 micrometer. It is understood that in an example including more than three stacks or less than three stacks, the range of total thickness does not necessarily vary. Only the thickness per layer is changed. Again the bismuth layers 18A, 18B and 18C are not necessarily of the same thickness. In an example, the bismuth layer 18A may have a thickness of 3 micrometer, the thickness of the bismuth layer 18B may be of 1 micrometer and the thickness of the bismuth layer 18C may be of 3 micrometer giving a total thickness of 7 micrometer which lies in a range from about 2 micrometer to about 10 micrometer. The thicknesses of the bismuth layers 18A, 18B and 18C may be also the same, for example, each one micrometer.

The total thickness of all antimony layers 20A, 20B and 20C may lie in a range from about 1 micrometer to about 6 micrometer. In one example, the thickness may lie in a range from about 2 micrometer to about 5 micrometer. In another example, the total thickness of all antimony layers may lie in a range from about 3 micrometer to about 4 micrometer.

A total thickness of the nickel layers 20A, 20B and 20C may lie in a range from about 0.1 micrometer to about 0.6 micrometer. In one example, the total thickness of the nickel layers 20A, 20B and 20C may lie in a range from about 0.2 micrometer to about 0.5 micrometer. In a further example, the total thickness of the nickel layers may lie in a range from about 0.3 micrometer to about 0.4 micrometer.

In the multi-stack layer example of FIG. 3 forming of an alloy while soldering the solder pad using an SAC387 solder may be further enhanced due to the alternating layers. The sequence or order of the layers is not necessarily the same in all stacks.

Figure 4:
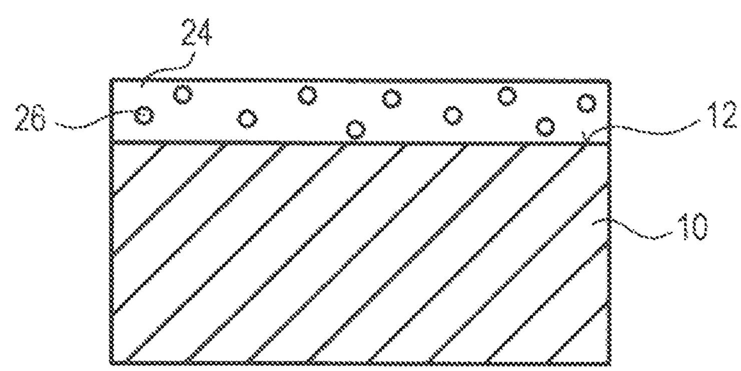
FIG. 4 schematically illustrates a fourth example of a solder pad in accordance with the disclosure in a cross-sectional view.

FIG. 4 shows a fourth example of a solder pad 10 with a surface 12. On the surface 12 a tin layer 24 may be arranged. The tin layer 24 may be applied as a reflowed metal particle paste. The tin layer 24 may include particles of at least one out of bismuth particles, antimony particles and nickel particles. During a soldering process the tin may melt and the particles 26 and the tin may interact with the solder components of SAC 387 to form a resistant solder joint.

Figure 5:
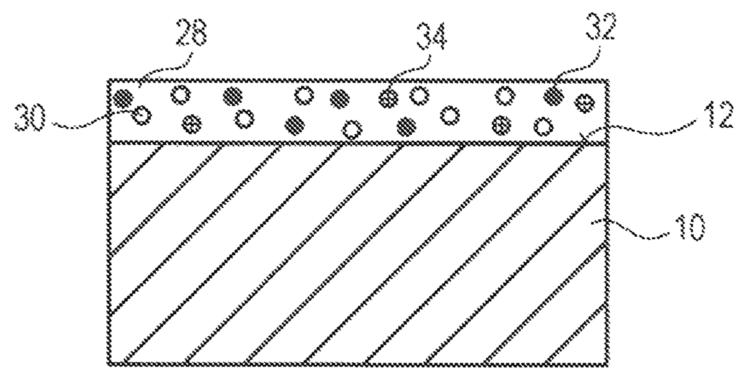
FIG. 5 schematically illustrates a fifth example of a solder pad in accordance with the disclosure in a cross-sectional view.

FIG. 5 shows a fifth example of a solder pad 10 with surface 12. On the surface 12 a tin layer 28 may be arranged. The tin layer 28 may be applied as a reflowed metal particle paste. The tin layer 28 may include bismuth particles 30, antimony particles 32 and nickel particles 34. In the example of FIG. 5, the bismuth particles are schematically illustrated as empty circles. In addition, the antimony particles are schematically illustrated as black points or filled circles. Further, the nickel particles are schematically illustrated as crossed circles. In an example, the effective volume percentage of tin in the tin layer 28 may lie in a range from about 20% to about 60%, or from about 30% to 50%.

In an example, the effective volume percentage of bismuth particles 30 in tin layer 28 may lie in a range from about 10% to about 40%. In a further example, the effective volume percentage of bismuth may lie in a range from about 20% to about 30%.

In an example, the effective volume percentage of antimony particles 32 in the tin layer 28 may lie in a range from about 5% to about 20%. In a further example, the effective volume percentage of antimony may lie in a range from about 10% to about 15%.

In an example, the effective volume percentage of nickel particles 34 in the tin layer 28 may lie in a range from about 1% to about 3%. In a further example, the effective volume percentage of nickel in the tin layer 28 may lie in a range from about 1.5% to about 2.5%.

Figure 6:
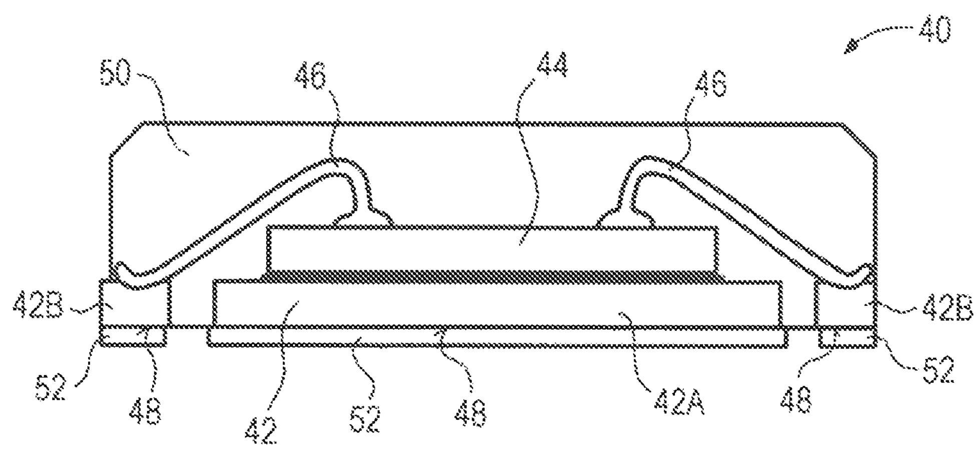
FIG. 6 schematically illustrates a first example of an electronic component in accordance with the disclosure in a cross-sectional view.

FIG. 6 schematically illustrates an electronic component 40 in a cross-sectional view. The electronic component 40 may include a leadframe 42. The leadframe 42 may have a die pad 42A and two lead pads 42B. A chip or die 44 may be attached to a first surface of the die pad 42A. Contacts of the die 44 (not illustrated) may be electrically connected via bond wires 46 to the lead pads 42B. A surface of the leadframe 42, which may form a solder pad surface 48, may be opposite to the surface on which the die 44 may be attached. The solder pad surface 48 may be opposite to a surface of the lead pads 42B to which the bond wires 46 may be connected to.

The electronic component 40 may further include a mold compound 50 forming a package. The package or mold compound 50 may cover the die 44, the bond wires 46 and at least partly the leadframe 42. The solder pad surface 48 may be not covered by the mold compound 50 and may form a mounting surface. On the solder pad surface 48 a layer 52 may be applied. It is understood that the layer 52 may correspond to the tin layer 28, as shown in FIG. 5, or to the tin layer 24, as shown in FIG. 4. In further examples, the layer 52 may correspond to a layer stack or a plurality of layer stacks as explained with reference to FIGS. 1 to 3. In other words, the layer 52 may include a tin layer 14, a bismuth layer 18, an antimony layer 20 and a nickel layer 22. It is understood that the layer 52 may be applied onto the solder pad surface, once the electronic component 40 is finished. In another example, the layer 52 may be applied onto the leadframe before finishing the electronic component.

In a further example, the electronic component may include a so-called leadless package. A leadless package does not necessarily include any leads extending from the package. A solder pad surface may be provided on a mounting surface of the package. On the solder pad surface a layer may be arranged which may correspond to the tin layer 28, as shown in FIG. 5, to the tin layer 24, as shown in FIG. 4 or to a layer stack or a plurality of layer stacks as explained with reference to FIGS. 1 to 3.

Figure 7:
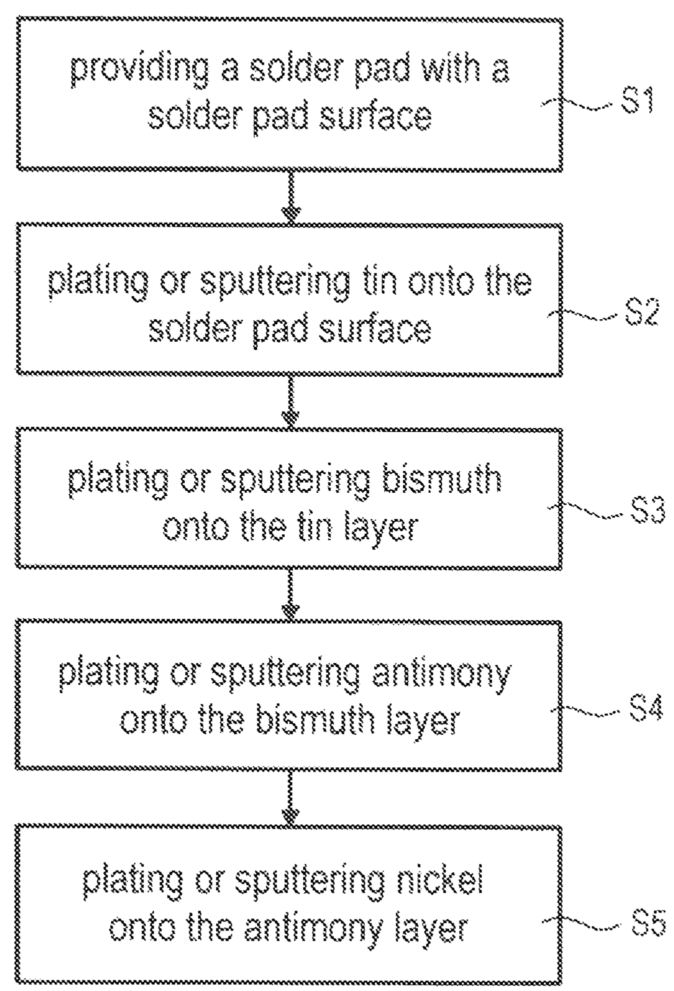
FIG. 7 illustrates an example of a method in accordance with the disclosure for enhancing a solder pad surface in a flow chart.

FIG. 7 schematically illustrates a method for enhancing a solder pad surface. In a step S1, a solder pad with a solder pad surface may be provided. In a step S2, tin may be plated or sputtered onto the solder pad surface to form a tin layer. In a step S3, bismuth may be plated or sputtered onto the tin layer to form a bismuth layer. In a step S4, antimony may be plated or sputtered onto the bismuth layer to form an antimony layer. In a step S5, nickel may be plated or sputtered onto the antimony layer forming a nickel layer. In a further example, steps S2 to S5 may be repeated one or more times to form a multi-stack example as shown in FIG. 3.

The enhanced solder pad surface may allow reliable package soldering onto a PCB with SAC solder paste. During the soldering process a bulk material may be formed which may provide a reliable solder joint.

It is understood that the proposed solder pads and enhancement of solder pads are not limited to a mounting of electronic components to boards. Rather, any solder joint may be improved by arranging the above described layers on a solder pad surface.

While the examples have been illustrated and described with respect to one or more implementations, alterations and/or modifications may be made to the illustrated examples without departing from the concept of the appended claims. In particular regard to the various functions performed by the above described structures, the terms (including a reference to a "means") used to describe such structures are intended to correspond, unless otherwise indicated, to any structure which performs the specified function of the described structure (e.g., that is functionally equivalent), even though not structurally equivalent to the disclosed structure which performs the function in the herein illustrated exemplary implementations of the disclosure.

What is claimed is:

1. A solder pad, comprising:

a surface;

a tin layer arranged on the surface; and three layers: a bismuth layer and an antimony layer and a nickel layer, which are arranged on the tin layer, wherein a first of the three layers is arranged on the tin layer, a second of the three layers is arranged on the first layer and the third of the three layers is arranged on the second layer, wherein each layer covers essentially the entire respective underlying layer.

2. The solder pad of claim 1, wherein a thickness of the tin layer lies in a range from about 5 micrometer to about 15 micrometer.

3. The solder pad of claim 1, wherein a thickness of the bismuth layer lies in a range from about 2 micrometer to about 10 micrometer.

4. The solder pad of claim 1, wherein a thickness of the antimony layer lies in a range from about 1 micrometer to about 6 micrometer.

5. The solder pad of claim 1, wherein a thickness of the nickel layer lies in a range from about 0.1 micrometer to about 0.6 micrometer.

6. The solder pad of claim 1, wherein the tin layer, the bismuth layer, the antimony layer and the nickel layer form a layer stack, and wherein a plurality of such layer stacks are formed on each other on the solder pad surface.

7. The solder pad of claim 6, wherein a total thickness of all tin layer thicknesses in the plurality of layer stacks lies in a range from about 5 micrometer to about 15 micrometer, a total thickness of all bismuth layer thicknesses in the plurality of layer stacks lies in a range from about 2 micrometer to about 10 micrometer, a total thickness of all antimony layer thicknesses in the plurality of layer stacks lies in a range from about 1 micrometer to about 6 micrometer, and a total thickness of all nickel layer thicknesses in the plurality of layer stacks lies in a range from about 0.1 micrometer to about 0.6 micrometer.

8. The solder pad of claim 7, wherein all layers made of a same material are of about the same thickness.

9. An electronic component, comprising the solder pad of claim 1.

10. The solder pad of claim 1, wherein the solder pad comprises copper.

11. The solder pad of claim 1, wherein the solder pad comprises aluminum.

12. The solder pad of claim 1, wherein the solder pad comprises a copper alloy.

13. The solder pad of claim 1, wherein the solder pad comprises an alloy 42.

14. The solder pad of claim 1, wherein the solder pad comprises a steel alloy.

15. The solder pad of claim 1, wherein the solder pad comprises an aluminum alloy.

16. The solder pad of claim 1, wherein the solder pad is plated with a metal layer.

17. The solder pad of claim 16, wherein the metal layer comprises silver.

18. A solder pad, comprising:

a surface;

a tin layer arranged on the surface; and three layers: a bismuth layer and an antimony layer and a nickel layer, which are arranged on the tin layer, wherein the tin layer, the bismuth layer, the antimony layer and the nickel layer form a layer stack, and wherein a plurality of such layer stacks are formed on each other on the solder pad surface.

19. A method for enhancing a solder pad surface of the solder pad of claim 1, the method comprising:

providing a solder pad comprising at least one solder pad surface;

plating or sputtering tin onto the at least one solder pad surface to form a first tin layer;

plating or sputtering a first of three materials bismuth, antimony, nickel onto the first tin layer to form a first material layer;

plating or sputtering a second of the three materials onto the first material layer to form a second material layer; and plating or sputtering the third of the three materials onto the second material layer to form a third material layer.

20. The method of claim 19, further comprising:

plating or sputtering tin onto the third material layer to form a second tin layer;

plating or sputtering a first of three materials bismuth, antimony, nickel onto the second tin layer to form a fourth material layer;

plating or sputtering a second of the three materials onto the fourth material layer to form a fifth material layer; and plating or sputtering the third of the three materials onto the fifth material layer to form a sixth material layer.

* * * * *